(12) United States Patent
Oprea et al.

(10) Patent No.: US 7,746,657 B2
(45) Date of Patent: Jun. 29, 2010

(54) 10G XFP COMPLIANT PCB

(75) Inventors: Dorin Oprea, Ottawa (CA); Steven Driediger, Ottawa (CA)

(73) Assignee: Alcatel Lucent, Paris (FR)

( * ) Notice: Subject to any disclaimer, the term of this patent is extended or adjusted under 35 U.S.C. 154(b) by 283 days.

(21) Appl. No.: 12/075,375

(22) Filed: Mar. 11, 2008

(65) Prior Publication Data

US 2009/0229859 A1    Sep. 17, 2009

(51) Int. Cl.
*H05K 7/00*    (2006.01)

(52) U.S. Cl. ...................... 361/760; 174/250

(58) Field of Classification Search ............... 361/760, 361/782; 174/250, 261, 262
See application file for complete search history.

(56) References Cited

U.S. PATENT DOCUMENTS

| | | | |
|---|---|---|---|
| 6,377,464 B1 * | 4/2002 | Hashemi et al. | 361/760 |
| 6,617,518 B2 * | 9/2003 | Ames et al. | 174/254 |
| 7,439,449 B1 * | 10/2008 | Kumar et al. | 174/254 |
| 2006/0118331 A1 * | 6/2006 | Nelson et al. | 174/261 |

* cited by examiner

*Primary Examiner*—Jeremy C Norris
*Assistant Examiner*—Yuriy Semenenko
(74) *Attorney, Agent, or Firm*—Galasso & Associates, L.P.; Raymond M. Galasso

(57) ABSTRACT

The present invention is a specially designed PCB that allows XFP compliant transceiver modules and EMI gaskets to be used in a manner specified in the XFP standard and results in an integrated solution that is compliant with the XFP standard. Various geometric features are incorporated into the PCB to achieve improvements that in combination result in an integrated solution meeting the XFP standard. Some of these improved features include: specific thickness of prepreg and other layering of the PCB, specific spacing, dimensions and weights for certain components of the PCB, an opening on the first layer XFP cage ground shield connecting to the EMI gasket, guard ground traces in the second layer surrounding the differential pair signal traces, openings in the copper of the third layer beneath the XFP cage ground shield and XFP connector pads, and ground vias at the XFP connector and PHY connector pads.

20 Claims, 4 Drawing Sheets

10G XFP COMPLIANT PCB

CROSS REFERENCE TO RELATED APPLICATIONS

This United States non-provisional patent application does not claim priority to any United States provisional patent application or any foreign patent application.

FIELD OF THE DISCLOSURE

The disclosures made herein relate generally to optical transceiver modules. More specifically, the invention described herein is a specialized printed circuit board (PCB) that allows 10 Gbps Small Form Factor Pluggable (XFP) compliant transceiver modules and Electromagnetic interference (EMI) gaskets to be used.

BACKGROUND

XFP is a standard that specifies the mechanical and electrical interface specifications between an optical transceiver module and a physical layer (PHY) device. It is desirable to be XFP compliant to ensure consumers can use transceivers from various manufacturers.

Various XFP compliant transceiver modules, connectors and test PCB boards are commercially available. However, when these parts are integrated into a system, the overall resulting device is non-compliant with XFP. No solution for providing a line card with an XFP compliant 10 Gbps optical port is currently known.

A printed circuit board (PCB) utilizes traces to electrically connect different electronic components. The traces are conductive pathways of copper used for relaying electrical signals. The traces are laminated onto a non-conductive substrate to form the PCB. The non-conductive substrate could include glass or other insulating materials.

Typically, the PCB is formed by using a blank PCB with a layer of copper covering the entire substrate and removing all the undesired copper to form the copper traces. However, copper traces can also be added to the substrate to form the PCB in certain cases.

Vias are holes through a PCB. The walls of the vias are copper plated to electrically connect the conducting layers of the PCB. Electronic components may be attached to pads on the outer surfaces of the PCB. Component leads can be fixed to the board via soldering.

Electromagnetic interference (EMI) is a disturbance caused in an electrical circuit by electromagnetic radiation. The disturbance can interrupt or degrade the circuit performance. Bypass capacitors, resistors, filtering, and shielding with EMI gaskets may be used to minimize these disturbances.

A line card is simply an electronic circuit on a PCB that interfaces with the telecommunications lines of subscribers to the telecommunications access network. As the name suggests, a transceiver is a device having both transmitter and receiver circuitry. Differential pairs are conductors found on PCBs for carrying differential signals.

At 10 gigabits per second (Gbps), even very tiny non-idealities in a PCB can have significant impact on the resulting signal. XFP specifications require a PCB footprint which constrains break-out options. The presence of the ground shield prevents component-side routing breakout. Routing near the ground requires minimizing impedance discontinuities and ground coupling.

One solution for component-side break out includes removing the EMI gasket to avoid making contact with the differential pair. The solder mask is prone to wear over time, however, and the close proximity of the XFP ground shield is also a concern.

A solder-side break-out solution is to drop vias in the XFP connector pin field and route on the solder side of the board. However, the undesirable and parasitic properties of the vias make meeting the electrical specifications (i.e. return loss) very difficult to achieve.

Hence, there is a need in the art for a convenient to use, inexpensive and efficient PCB interconnect for the XFI interface between a 10 Gbps PHY and an XFP transceiver meeting all of the requirements of the XFP standard.

SUMMARY OF THE DISCLOSURE

The preferred embodiment of the invention involves the design of a Network Termination Card that uses the transceivers in its 10 Gbps optical ports. A specially designed PCB allows XFP compliant transceiver modules and EMI gaskets to be used in a manner specified in the XFP standard and results in an integrated solution that is compliant with the XFP standard.

Various geometric features are incorporated into the PCB to achieve improvements that in combination result in an integrated solution meeting the XFP standard. Some of these improved features include: an opening on the first layer XFP cage ground shield connecting to the EMI gasket, guard ground traces in the second layer surrounding the differential pair signal traces, openings in the copper of the third layer beneath the XFP cage ground shield and XFP connector pads, and ground vias at the XFP connector and PHY connector pads.

The principal object of this invention is to provide a functional PCB interconnect for the XFI interface between a 10 Gbps PHY and an XFP transceiver meeting all of the requirements of the XFP standard.

Another object of this invention is to provide a cost-effective PCB interconnect for the XFI interface between a 10 Gbps PHY and an XFP transceiver meeting all of the requirements of the XFP standard.

Another object of this invention is to provide a PCB interconnect for the XFI interface between a 10 Gbps PHY and an XFP transceiver meeting all of the requirements of the XFP standard that may utilize a low-cost substrate material for the PCB to keep the device in line with pricing targets.

Yet another object of this invention is to provide a reliable PCB interconnect for the XFI interface between a 10 Gbps PHY and an XFP transceiver meeting all of the requirements of the XFP standard.

DETAILED DESCRIPTION OF THE DRAWINGS

Figure 1:
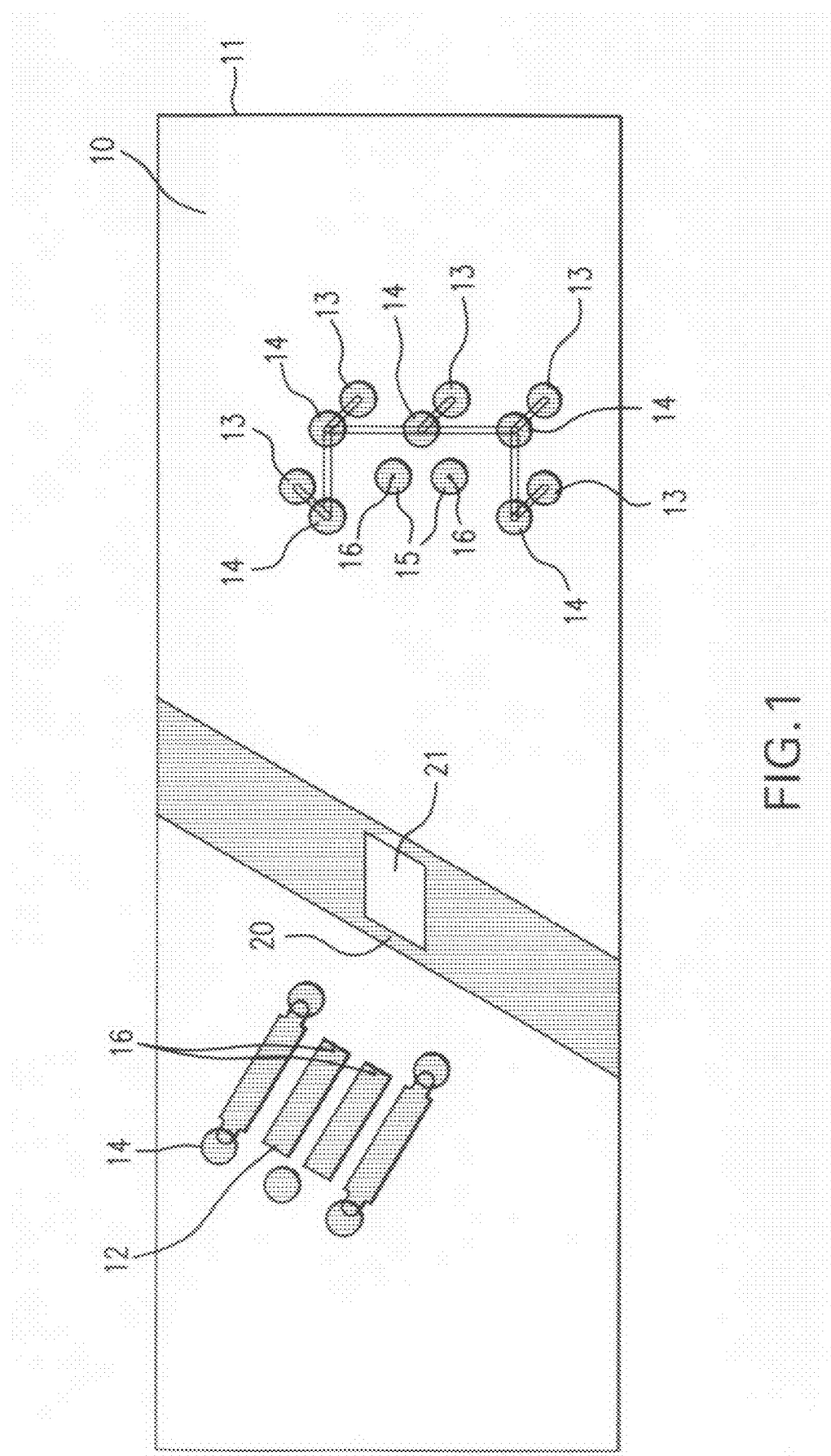
FIG. 1 depicts an overhead view of the preferred embodiment of the present invention.

FIG. 1 depicts an overhead view of the preferred embodiment of the present invention. The first layer 10 of the PCB 11 is depicted. The first layer 10 has XFP connector pads 12 on one end. The XFP connector pads 12 are rectangular and aligned in parallel at a diagonal on one side of the first layer 10 in this embodiment as determined by the XFP optical device placement on the face plate. Four XFP connector pads 12 are aligned in this manner on the first layer 10 of the preferred embodiment. The dimensions of the connector pads are defined by the footprint specified in the XFP multi-source agreement (MSA).

Standard XFP connector pads are quite large and can introduce a large capacitance. Some vendors offer connectors that support shorter XFP connector pads, but these shorter XFP connector pads are not footprint compatible with standard XFP connectors. In the present invention, as discussed in greater detail with respect to FIG. 3, an opening in the third layer of the PCB 11 beneath the XFP connector pads 12 is used to minimize the XFP connector pad capacitance.

The XFP connector pads 12 are surrounded by and operatively connected to a plurality of ground vias 14. These ground vias 14 provide a solid reference path for signals. The ground vias 14 are approximately cylindrical and create openings between the first layer 10 of the PCB 11 and fourth layer of the PCB 11. In this embodiment, the XFP connector pads 12 are 0.6 millimeter pads and the ground vias 14 have a finished hole size of 0.25 millimeter, although the exact geometry of the ground vias 14 is not critical to the invention.

PHY ground pads 13 are located on the opposite end of the first layer 10 of the PCB 11 from the XFP connector pads 12. Additional ground vias 14 around the PHY ground pads 13 also provide a solid reference path for signals. These ground vias 14 are also present from the first layer 10 of the PCB 11 to the fourth layer of the PCB 11 and are connected to each other on the first layer 10.

Blind vias 16 are located inside the PHY signal pads 15 also located on the opposite end of the first layer 10 from the XFP connector pads 12. These blind vias 16 route between the first layer 10 and second layer of PCB 11. The blind vias 16 do not penetrate through the entire PCB 11, but only extend from the first layer 10 (surface layer) to the first internal layer (second layer). No via stub is created by the blind vias. A signal comes in at the XFP connector pads 12 and travels out at the PHY signal pads 15.

To minimize costs, the blind vias of the preferred embodiment are relatively short between the first layer 10 and the second layer of the PCB 11. This also serves to minimize via parasitics that could harm electrical performance. In the preferred embodiment, a double layer of prepreg is used between the first layer 10 and the second layer for safety reasons. Prepreg is a non-cured glass/epoxy sheet that acts as the glue during multilayer lamination.

The blind vias of the preferred embodiment are small enough to use via-in-pad. In this embodiment, a 0.15 millimeter finished hole size is used. A relatively wide blind via helps ensure that the blind vias are economical. In the preferred embodiment shown in FIG. 1, two blind vias 16 are located on the bottom of two of the XFP connector pads 12 and two blind vias 16 are located inside the PHY signal pads 15.

An XFP cage ground shield 20 made of copper with an opening 21 that is shaped like a parallelogram is located in approximately the center of the first layer 10 in this embodiment. The XFP cage ground shield 20 extends in angular alignment with the XFP connector pads 12. Two sides of the opening 21 are parallel to the back of the XFP cage ground shield 20 and the other two sides are parallel to the differential pair (located in the second layer and discussed in conjunction with FIG. 2).

There is a 0.005 inch distance between the outer edges/sides of the opening 21 and the outer edges of the XFP cage ground shield 20. The 0.005 inch distance on each side of the opening 21 is present to ensure good electrical connection, however, other dimensions can also be utilized. A gasket also makes contact with the XFP cage ground shield 20 in this embodiment.

The XFP cage ground shield 20 is part of the electrical skin of the system. The XFP cage ground shield 20 can carry ESD transients which may damage the sensitive differential pair (located and discussed in conjunction with the second layer of FIG. 2). The XFP cage ground shield 20 could also conduct internal noise to be radiated, thus posing an EMC concern. Coupling of the XFP cage ground shield 20 to the differential pair causes an impedance discontinuity which degrades the electrical performance of the link. The opening 21 helps minimize the impact of the XFP cage ground shield 20 coupling to the differential pair. To minimize the impedance discontinuity from the remaining XFP cage ground shield 20, openings are located on the third layer below this layer (as discussed in conjunction with FIG. 3). Maximizing the distance between the first layer 10 and the second layer of the PCB 11 will also aid in minimizing the impedance discontinuity from the XFP cage ground shield 20. A prepreg (dielectric between the first layer and the second layer 25) thickness of 3.8 mils (0.0038 inch) is used in this preferred embodiment.

Figure 2:
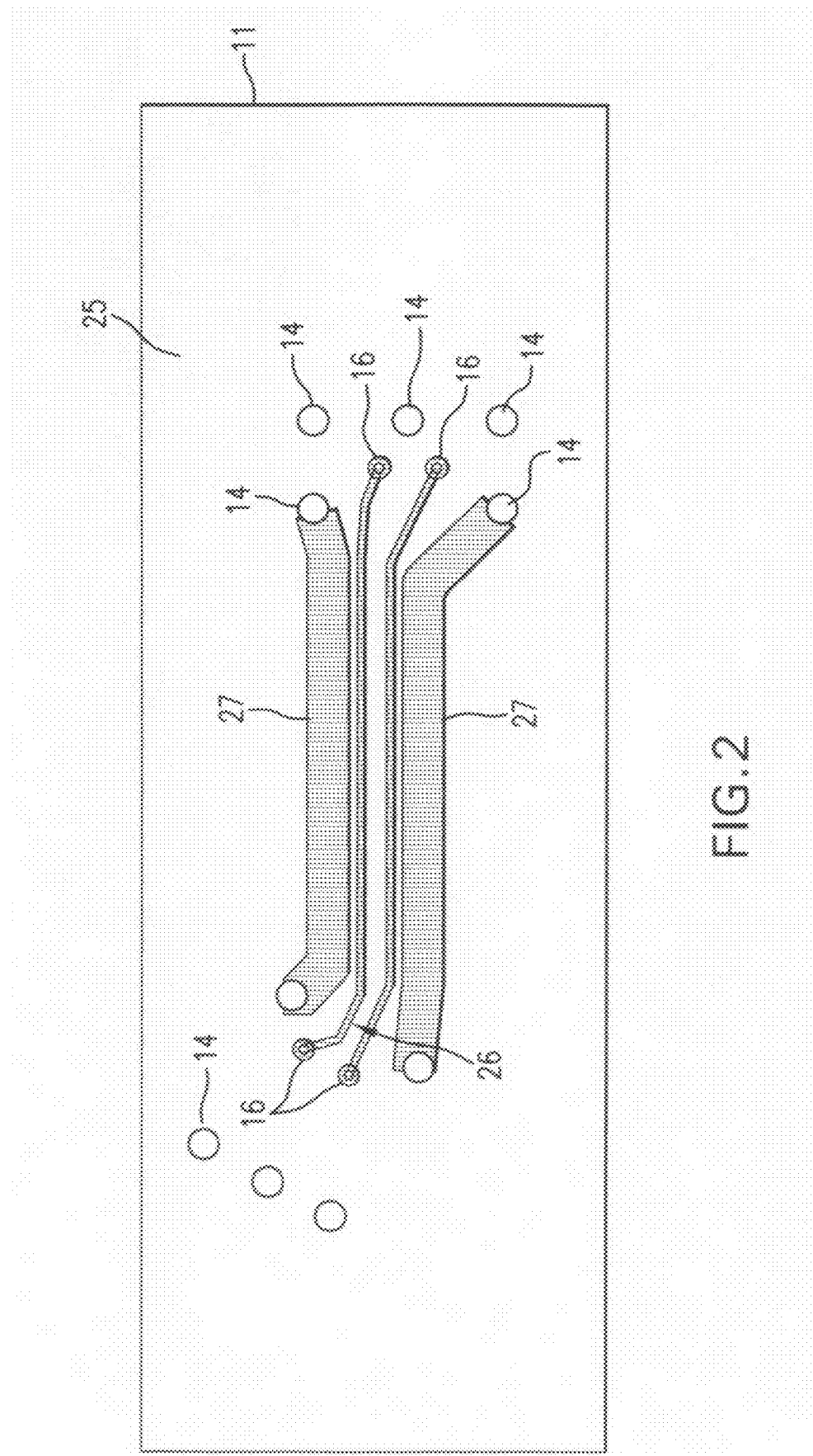
FIG. 2 depicts an overhead view of the second layer of the preferred embodiment of the present invention.

FIG. 2 depicts an overhead view of the second layer of the preferred embodiment of the present invention. The second layer 25 is the first internal layer of the PCB 11. The second layer 25 contains two traces of a differential pair 26 that run approximately in parallel to one another and extend across a portion of the length of the PCB 11. Each trace of the differential pair 26 is optimally between 0.4 inch and 0.7 inch though a variety of lengths may be utilized. However, for optimum performance the differential pair 26 should not be made too short. Longer differential pairs slow down the signal edges which reduces reflections from discontinuities and improves the return loss.

For the same reason, the traces of the second layer 25 in the preferred embodiment are kept thin and narrow. A width of 0.005 inch and 0.5 ounce of copper are utilized for each trace of the differential pair 26 in the preferred embodiment. The spacing between each trace of the differential pair 26 is 0.010 inch in this preferred embodiment. A tight coupling between the differential pair 26 of 0.010 inch helps minimize coupling to the XFP cage ground shield. Having each of the differential pair 26 narrow also helps minimize coupling to XFP cage ground shield.

Each trace of the differential pair 26 must be skewed at the ends to be able to connect to the XFP connector pads and PHY signal pads. Any skew compensation must be done close to the source of skew (i.e. bends). Each of the ends of the differential pair 26 is connected to the blind vias 16 coming from the first layer of the PCB 11. Return loss is actually improved by introducing some very high frequency loss in the differential pair 26.

Guard traces 27 are also located on the second layer 25 on either side of the differential pair 26. The guard traces 27 are also tied to the ground plane of the fourth layer beneath the PHY ground pads and the XFP connector pads. The ground vias 14 tying the guard traces 27 to the ground plane are shown on the second layer 25. The guard traces 27 route the differential pair 26 on the second layer 25 to provide tighter coupling to digital ground. The guard traces 27 reduce the gasket impact on the 10 Gbps signal. However, the addition of the guard traces 27 make the differential pair 26 more sensitive to signal skew. To mitigate this, the coupling of the differential pair 26 to the guard traces 27 is reduced near the bends. Each of the guard traces is approximately 0.005 inch from the differential pair 26 along most of the length of the differential pair 26. However, this distance increases at the ends of the differential pair 26 where the differential pair 26 skews. Ideally, the guard traces 27 are greater than or equal to four times wider than the signal trace width. The guard traces 27 are at least 0.020 inch in this particular embodiment.

Figure 3:
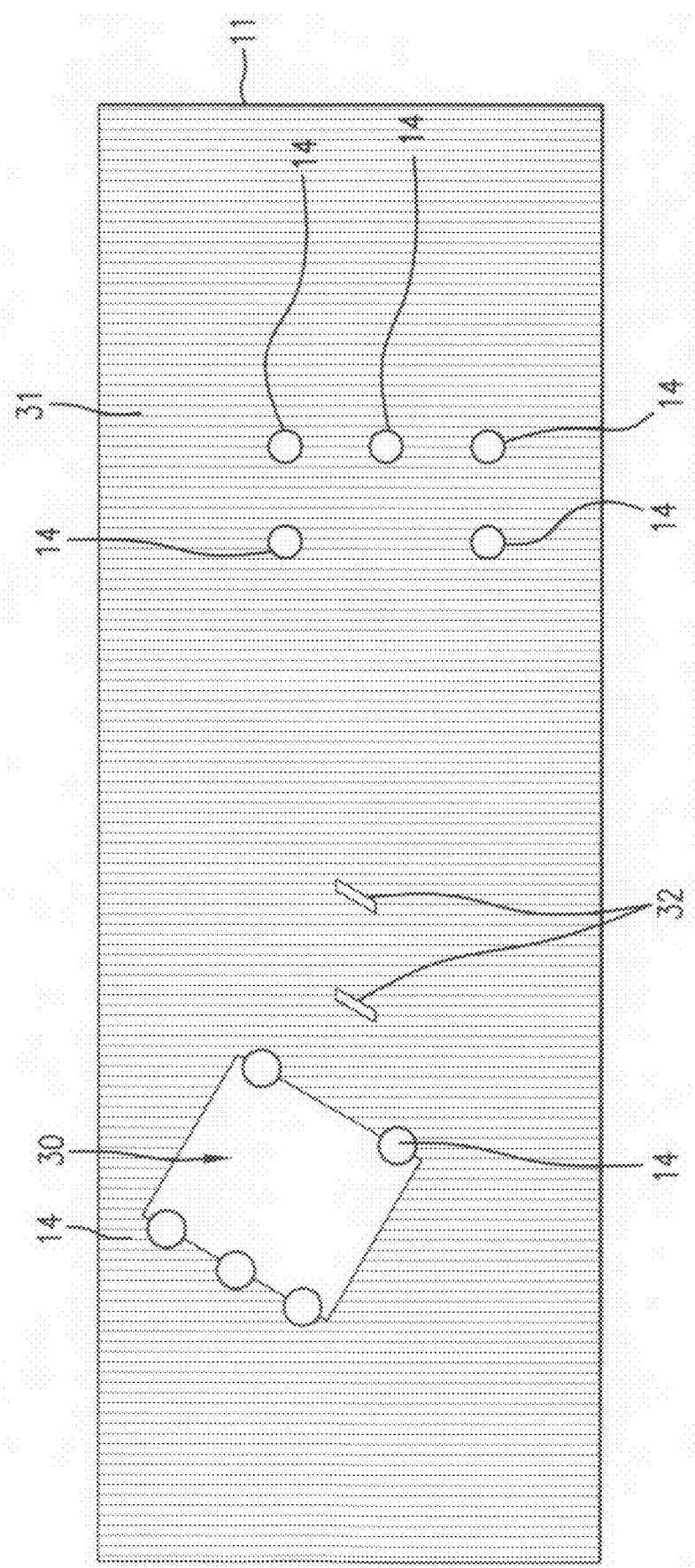
FIG. 3 depicts an overhead view of the third layer of the preferred embodiment of the present invention.

FIG. 3 depicts an overhead view of the third layer of the preferred embodiment of the present invention. The third layer 31 is 0.0012 inch thick and is spaced by 0.004 inch of a core from the second layer of the PCB 11 in this preferred embodiment. An XFP opening 30 shaped like a rectangle is present on the third layer 31 of the PCB 11 and its position and precise geometry is determined by the XFP connector pad orientation. The XFP opening 30 is located on the third layer 31 directly beneath the XFP connector pads on the first layer of the PCB 11. The XFP opening 30 helps minimize the XFP connector pad capacitance.

Two XFP cage ground shield openings 32 are also present on the third layer 31 of the PCB 11. The XFP cage ground shield openings 32 are cut-out under the XFP cage ground shield and are designed to have their outer edges the same width apart as the outer edges of the XFP cage ground shield in this embodiment. The width of the XFP cage ground shield openings 32 are the same as the width of the overlapping copper of the XFP cage ground shield on the first layer of the PCB 11 (i.e. the width between the outer edge of the opening on the XFP cage ground shield and the outer edge of the XFP cage ground shield). The length of the XFP cage ground shield openings are such that they extend on the third layer 31 beneath and between the guard traces of the second layer of the PCB 11 and at the same angle as the XFP cage ground shield on the first layer. The XFP cage ground shield openings 32 compensate for the added capacitive coupling on the 10 Gbps signal traces caused by the copper shielding on the first layer of the PCB 11. The ground vias 14 are also visible on the third layer 31.

Figure 4:
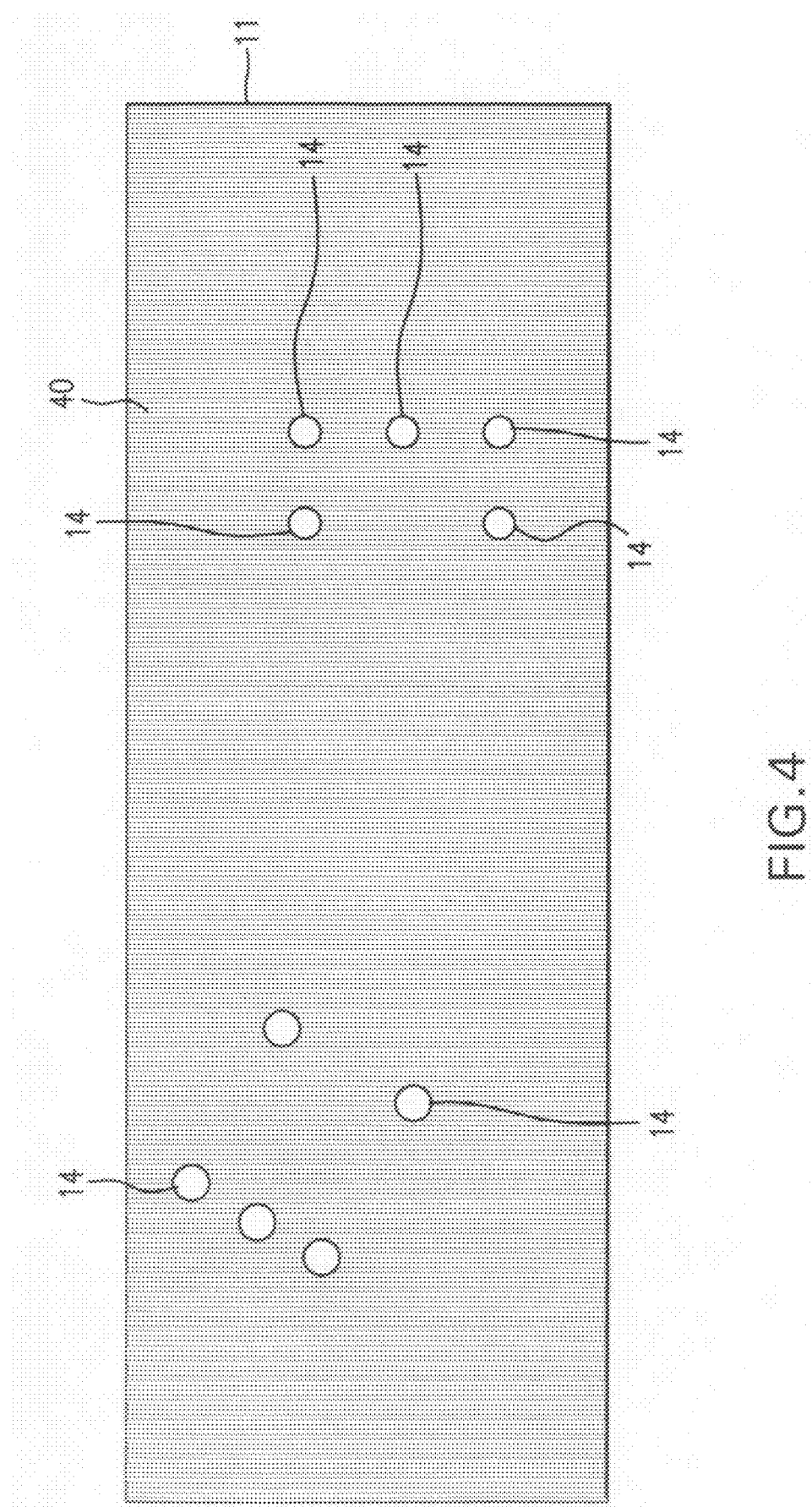
FIG. 4 depicts an overhead view of the fourth layer of the preferred embodiment of the present invention.

FIG. 4 depicts an overhead view of the fourth layer of the preferred embodiment of the present invention. There is 0.006 inch of prepreg between the third layer and fourth layer 40 of PCB 11. The fourth layer 40 of the PCB 11 is 0.0012 inch thick and serves as ground for the PCB 11. The ground vias 14 are also visible on the fourth layer 40.

It will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims. Indeed, some of the features disclosed herein could be removed if a higher performance substrate were used in the PCB.

What is claimed is:

1. A device for interconnecting a Small Form Factor Interface (XFI) between a 10 Gbps Physical Layer (PHY) and a Small Form Factor Pluggable (XFP) transceiver comprising:
    (a) a first layer having a plurality of XFP connector pads surrounded by and operatively connected to a first plurality of ground vias, a first PHY signal pad and a second PHY signal pad and a plurality of PHY ground pads having a second plurality of ground vias, and an XFP cage ground shield with an opening;
    (b) a second layer located beneath the first layer having a differential pair with a first trace and a second trace and a first guard trace and a second guard trace surrounding the differential pair;
    (c) a third layer located beneath the second layer having an XFP opening beneath the plurality of XFP connector pads and a first XFP cage ground shield opening and a second XFP cage ground shield opening beneath the XFP cage ground shield;
    (d) a fourth layer located beneath the third layer serving as ground; and
    (e) a plurality of blind vias extending between the first layer and the second layer and operatively connected to the differential pair and the plurality of XFP connector pads and the first PHY signal pad and the second PHY signal pad.

2. The device of claim 1 wherein the plurality of XFP connector pads is located on a first end of the first layer.

3. The device of claim 2 wherein each of the plurality of XFP connector pads is rectangular and aligned in parallel at a diagonal on the first layer.

4. The device of claim 1 wherein each of the first plurality of ground vias and each of the second plurality of ground vias is approximately cylindrical and extends between the first layer and the fourth layer.

5. The device of claim 2 wherein the plurality of PHY ground pads and the first PHY signal pad and the second PHY signal pad are located on a second end of the first layer opposite the first end.

6. The device of claim 1 wherein a double layer of prepreg is used between the first layer and the second layer.

7. The device of claim 1 wherein the plurality of blind vias includes a first blind via located on a first one of the plurality of XFP connector pads and a second blind via located on a second one of the plurality of XFP connector pads and a third blind via located within the first PHY signal pad and a fourth blind via located within the second PHY signal pad.

8. The device of claim 1 wherein the opening on the XFP cage ground shield is approximately a parallelogram having a first side a second side a top and a bottom.

9. The device of claim 1 wherein the XFP cage ground shield is made of copper.

10. The device of claim 1 wherein the XFP cage ground shield extends across the first layer in angular alignment with the plurality of XFP connector pads.

11. The device of claim 1 wherein the first trace and the second trace of the differential pair extend across a portion of the second layer in approximately parallel alignment.

12. The device of claim 1 wherein the first trace and the second trace of the differential pair are routed with approximately half an ounce of copper.

13. The device of claim 1 wherein the first trace has a first skewed end and a second skewed end opposite the first skewed end and the second trace of the differential pair has a third skewed end and a fourth skewed end opposite the third skewed end.

14. The device of claim 1 wherein the first guard trace and the second guard trace are tied to the third layer and the fourth layer beneath the plurality of PHY ground pads and the plurality of XFP connector pads.

15. The device of claim 1 wherein the first guard trace and the second guard trace are greater than or equal to four times the width of the first trace and the second trace.

16. The device of claim 8 wherein the first XFP cage ground shield opening is located beneath and between a first outer edge of the XFP cage ground shield and the first side of the opening on the XFP cage ground shield and the second XFP cage ground shield opening is located beneath and between a second outer edge of the XFP cage ground shield and the second side of the opening of the XFP cage ground shield.

17. The device of claim 16 wherein the first XFP cage ground shield opening and the second XFP cage ground shield opening are beneath the differential pair and extend between the first guard trace and the second guard trace.

18. A device for interconnecting a PHY and a transceiver comprising:
   (a) a first layer having a plurality of connector pads surrounded by and operatively connected to a first plurality of ground vias, a first PHY signal pad and a second PHY signal pad and a plurality of PHY ground pads having a second plurality of ground vias, and a cage ground shield with an opening;
   (b) a second layer located beneath the first layer having a differential pair with a first trace and a second trace and a first guard trace and a second guard trace surrounding the differential pair;
   (c) a third layer located beneath the second layer having an opening beneath the plurality of connector pads and a first cage ground shield opening and a second cage ground shield opening beneath the cage ground shield;
   (d) a fourth layer located beneath the third layer serving as ground; and
   (e) a plurality of blind vias extending between the first layer and the second layer and operatively connected to the differential pair and the plurality of connector pads and the first PHY signal pad and the second PHY signal pad.

19. The device of claim 18 wherein the opening on the cage ground shield is approximately a parallelogram having a first side and a second side extending parallel to a first outer edge and a second outer edge of the cage ground shield and a top and a bottom extending parallel to the differential pair.

20. The device of claim 19 wherein the first cage ground shield opening is located beneath and between the first outer edge of the cage ground shield and the first side of the opening on the cage ground shield and the second cage ground shield opening is located beneath and between the second outer edge of the cage ground shield and the second side of the opening of the cage ground shield and both the first cage ground shield opening and the second cage ground shield opening are beneath the differential pair and extend between the first guard trace and the second guard trace.

* * * * *